(12) United States Patent
Goeddel et al.

(10) Patent No.: US 12,237,292 B2
(45) Date of Patent: Feb. 25, 2025

(54) CIRCUITS INCLUDING MICROPATTERNS AND USING PARTIAL CURING TO ADHERE DIES

(71) Applicant: 3M INNOVATIVE PROPERTIES COMPANY, St. Paul, MN (US)

(72) Inventors: Teresa M. Goeddel, St. Paul, MN (US); Ankit Mahajan, Cupertino, CA (US); Mikhail L. Pekurovsky, Bloomington, MN (US); Saagar A. Shah, Minneapolis, MN (US); Kara A. Meyers, Oakdale, MN (US); Christopher G. Walker, Edina, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 416 days.

(21) Appl. No.: 17/756,208

(22) PCT Filed: Nov. 30, 2020

(86) PCT No.: PCT/IB2020/061289
§ 371 (c)(1),
(2) Date: May 19, 2022

(87) PCT Pub. No.: WO2021/111279
PCT Pub. Date: Jun. 10, 2021

(65) Prior Publication Data
US 2022/0352108 A1  Nov. 3, 2022

Related U.S. Application Data

(60) Provisional application No. 62/943,427, filed on Dec. 4, 2019.

(51) Int. Cl.
*H01L 23/00* (2006.01)

(52) U.S. Cl.
CPC .............. *H01L 24/27* (2013.01); *H01L 24/19* (2013.01); *H01L 24/20* (2013.01); *H01L 24/24* (2013.01);
(Continued)

(58) Field of Classification Search
CPC ......... H01L 24/27; H01L 24/73; H01L 24/92; H01L 2224/211; H01L 2224/215; H01L 2224/24225; H01L 2224/27515
See application file for complete search history.

(56) References Cited

U.S. PATENT DOCUMENTS 5,895,971 A  4/1999 Nakanishi
2006/0226576 A1* 10/2006 O'Brien ................. G02B 6/423
264/293

(Continued)

FOREIGN PATENT DOCUMENTS

EP  1420441 A1  5/2004
EP  2048704 A1  4/2009
(Continued)

OTHER PUBLICATIONS

International Search Report for PCT International Application No. PCT/IB2020/061289, mailed on Apr. 9, 2021, 5 pages.

*Primary Examiner* — Mamadou L Diallo
(74) *Attorney, Agent, or Firm* — Thomas M. Spielbauer

(57) ABSTRACT

A method comprises: providing a layer of curable adhesive material (4) on a substrate (2); forming a pattern of microstructures (321) on the layer of curable adhesive material
(Continued)

(4); curing a first region (42) of the layer of curable adhesive material (4) at a first level and a second region (44) of the layer of curable adhesive material (4) at a second level greater than the first level; providing a solid circuit die (6) to directly attach to a major surface of the first region (42) of the layer of curable adhesive material (4); and further curing the first region (42) of the layer of curable adhesive material (4) to anchor the solid circuit die (6) on the first region (42) by forming an adhesive bond therebetween. The pattern of microstructures (321) may include one or more microchannels (321), the method further comprising forming one or more electrically conductive traces in the microchannels (321), in particular, by flow of a conductive particle containing liquid (8) by a capillary force and, optionally, under pressure. The at least one microchannel (321) may extend from the second region (44) to the first region (42) and have a portion beneath the solid circuit die (6). The solid circuit die (6) may have at least one edge disposed within a periphery of the first region (42) with a gap therebetween. The solid circuit die (6) may have at least one contact pad (72) on a bottom surface thereof, wherein the at least one contact pad (72) may be in direct contact with at least one of the electrically conductive traces in the microchannels (321). Forming the pattern of microstructures (321) may comprise contacting a major surface of a stamp (3) to the layer of curable adhesive material (4), the major surface having a pattern of raised features (32) thereon. The curable adhesive material (4) may be cured by an actinic light source such as an ultraviolet (UV) light source (7, 7'), wherein a mask may be provided to at least partially block the first region (42) of the layer of curable adhesive material (4) from the cure. The stamp (3) may be positioned in contact with the curable adhesive material (4) to replicate the pattern of raised features (32) to form the microstructures (321) while the curable adhesive material (4) is selectively cured by the actinic light source such as the ultraviolet (UV) light source (7). The first region (42) of the layer of curable adhesive material (4) may be cured at the first level to allow a bottom surface of the solid circuit die (6) to be fluidly-sealed by the major surface of the first region (42). The second region of the layer of curable adhesive material (4) may be cured at the second level such that the second region (44) is fully cured. The further curing may be any suitable curing such as thermal curing, radiation curing (e.g., by actinic radiation, such as ultraviolet (UV) radiation) or self-curing at room temperature without using a thermal or radiation curing source.

14 Claims, 3 Drawing Sheets

(52) U.S. Cl.
CPC .............. *H01L 24/29* (2013.01); *H01L 24/32* (2013.01); *H01L 24/73* (2013.01); *H01L 24/82* (2013.01); *H01L 24/83* (2013.01); *H01L 24/92* (2013.01); *H01L 2224/211* (2013.01); *H01L 2224/215* (2013.01); *H01L 2224/24225* (2013.01); *H01L 2224/2732* (2013.01); *H01L 2224/27515* (2013.01); *H01L 2224/29019* (2013.01); *H01L 2224/29191* (2013.01); *H01L 2224/32225* (2013.01); *H01L 2224/73217* (2013.01); *H01L 2224/82102* (2013.01); *H01L 2224/82104* (2013.01); *H01L 2224/83856* (2013.01); *H01L 2224/83874* (2013.01); *H01L 2224/9202* (2013.01); *H01L 2224/92144* (2013.01); *H01L 2924/3511* (2013.01)

(56) References Cited

U.S. PATENT DOCUMENTS

| | | | |
|---|---|---|---|
| 2007/0240773 A1* | 10/2007 | Zimmermann | F16K 99/0001 137/557 |
| 2008/0286152 A1* | 11/2008 | Schmidt | B81C 1/00634 422/68.1 |
| 2011/0266039 A1 | 11/2011 | Tomoda | |
| 2012/0313253 A1 | 12/2012 | Nakadaira et al. | |
| 2018/0127625 A1 | 5/2018 | Shafer et al. | |
| 2018/0155575 A1 | 6/2018 | Anderson et al. | |
| 2018/0371298 A1 | 12/2018 | Schmid et al. | |
| 2022/0315418 A1* | 10/2022 | Ogawa | B81C 1/00357 |

FOREIGN PATENT DOCUMENTS

| | | | | |
|---|---|---|---|---|
| EP | 1720389 | A2 | 7/2019 | |
| JP | 10321673 | A | 12/1998 | |
| WO | 2003041130 | A2 | 5/2003 | |
| WO | 2014188055 | A1 | 11/2014 | |
| WO | 2018094057 | A1 | 5/2018 | |
| WO | 2019043355 | A1 | 3/2019 | |
| WO | 2019171214 | A1 | 9/2019 | |
| WO | 2019224670 | A1 | 11/2019 | |
| WO | WO-2021059092 | A1 * | 4/2021 | H01L 23/3121 |

\* cited by examiner

CIRCUITS INCLUDING MICROPATTERNS AND USING PARTIAL CURING TO ADHERE DIES

CROSS REFERENCE TO RELATED APPLICATIONS

This application is a national stage filing under 35 U.S.C. 371 of PCT/IB2020/061289, filed Nov. 30, 2020, which claims the benefit of U.S. Application No. 62/943,427, filed Dec. 4, 2019, the disclosure of which is incorporated by reference in its/their entirety herein.

BACKGROUND

Integration of solid semiconductor dies with printing techniques combines the computational prowess of semiconductor technology with the high-throughputs and form-factor flexibility of web-based processes. Flexible hybrid electronics manufacturing requires that semiconductor dies be reliably and accurately registered to printed traces on moving webs. Alignment mechanisms suitable for wafer-based semiconductor devices may not be readily transferred to web-based processes.

SUMMARY

Briefly, in one aspect, the present disclosure describes a method including providing a layer of curable adhesive material on a substrate, forming a pattern of microstructures on the layer of curable adhesive material, curing a first region of the layer at a first level and a second region of the layer at a second level greater than the first level, providing a solid circuit die to directly attach to a major surface of the first region, and further curing the first region of the layer to anchor the solid circuit die on the first region by forming an adhesive bond therebetween.

In another aspect, the present disclosure describes an article including a layer of ultraviolet (UV) cured adhesive material. The layer includes a first region and a second region at least partially surrounding the first region, the layer extending continuously from the first region to the second region. A solid circuit die is directly adhered to a major surface of the first region via an adhesive bond. A pattern of microchannels is formed on the layer of ultraviolet (UV) cured adhesive material. One or more electrically conductive traces are formed in the microchannels.

Various unexpected results and advantages are obtained in exemplary embodiments of the disclosure. One such advantage of exemplary embodiments of the present disclosure is that a solid circuit die can directly attach to a partially cured or not cured region of a microchannel layer which includes curable adhesive materials being selectively blocked from cure and having a wet surface. Such a wet surface can fluidly-seal the bottom surface and edges of the solid circuit die and prevent fluid leakage from the microchannels. This also reduces the number of process steps required in making such devices by avoiding using additional adhesives to attach the solid circuit die to the microchannel layer, which may reflow into microchannels and block the microchannels.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
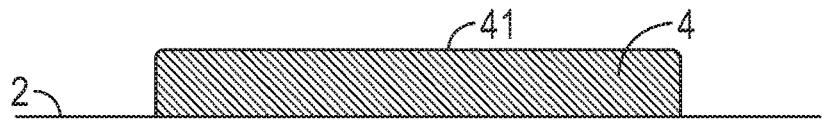
FIG. 1 is a cross-sectional view of a layer of curable adhesive material disposed on a substrate, according to one embodiment.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

The term "cure," "curing," or "cured" refers to chemically crosslinking, such as by exposing to radiation in any form, heating, or allowing to undergo a chemical reaction that results in hardening of a material or an increase in viscosity (e.g., under ambient temperature or heated conditions).

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

The terms "about" or "approximately" with reference to a numerical value or a shape means+/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but are to be controlled by the limitations set forth in the claims and any equivalents thereof. Various exemplary embodiments of the disclosure will now be described with particular reference to the Drawings.

FIG. 1 is a cross-sectional view of a layer 4 of curable adhesive material disposed on a substrate 2, according to one embodiment. The curable adhesive material can include any suitable curable, adhesive materials, after being cured, to adhesively bond a solid circuit die onto the major adhesive surface 41 thereof. In general, an adhesive material used herein, before fully cured, can provide a wet surface to wet out the bottom surface and edges of a solid circuit die disposed thereon. Upon further curing, an adhesion can be formed which is strong enough to anchor the solid circuit die such that the die may not be easily displaced from its original position during subsequent handling. The curable adhesive material may also be capable of maintaining its structure, e.g., not reflowing on the substrate 2 after it is disposed on the substrate 2. Exemplary adhesives may include structural adhesives, acrylic adhesives, epoxy adhesive, urethane adhesives, optical adhesives, silicone-based adhesives, etc.

In some embodiments, a two-stage curable structural adhesive can be applied. A suitable two-stage structural adhesive may experience a first curing step that initiates or catalyzes a reaction and enables some repositionability followed by a second curing step that finishes the reaction.

In the present disclosure, many embodiments utilize actinic radiation such as ultraviolet or UV light to cure adhesive materials. One useful class of actinic light sources uses light emitting diodes ("LED"). LED-based UV sources may be advantageous because they can generate UV light over a much narrower wavelength range compared with other UV light sources such as black lights and mercury lamps. Such LED sources are commercially available, for example, the AC Series 365 nm or 395 nm LED Curing Systems available from Excelitas Technologies (Waltham, Mass.).

A suitable UV curable adhesive material described herein may contain an adhesive composition that can begin to cure when exposed to UV light, which may or may not require heat for curing. Heat may be used to accelerate the rate of cure for a UV curable adhesive material. For example, a UV curable adhesive material may include monomer component(s) and photoinitiator(s) which may be irradiated with activating UV radiation to polymerize the monomer component(s).

When the adhesive material is fully cured, e.g., via a UV light, the adhesive material may form a non-tacky, dimensionally stable solid mass. When the adhesive material is not cured or only partially cured, the adhesive material may have a wet surface. When a solid circuit die is attached to the wet surface of the not-fully-cured adhesive material, the wet surface can wet out the bottom surface and edges of the solid circuit die.

Exemplary UV-activated adhesives can be made from a mixture of a plurality of resin components and additives using any of known methods. In some embodiments, the adhesives can be prepared using a hot melt process, which avoids use of volatile solvents. Volatile solvents are often undesirable because of costs associated with procurement, handling and disposal of these components. A hot melt process can be carried out using a batch or continuous process to have the adhesive components sufficiently mixed.

UV curable adhesives may include various components including, for example, free radical-polymerizable resins, ethylenic ally unsaturated monomers, epoxy resins, vinyl ethers, polyols, polymeric resins such as polyesters, etc. Various components of a UV curable adhesive and methods of making the same were described in U.S. Patent Application Publication Nos. 2018/0371298 (Schmid et al.), 2018/0155575 (Anderson et al.), and 2018/0127625 (Shafer et al.), which are incorporated herein by reference.

Another exemplary UV curable adhesive is commercially available from Norland Products Inc., Cranbury, NJ, under the trade designation of NOA73. NOA73 is an optically clear, liquid adhesive that quickly cures when exposed to long wavelength ultraviolet light. NOA73 can be cured by ultraviolet light, with maximum absorption between 350 and 380 nanometers. A typical energy required for full cure is about 4 Joules/sq. cm of long wavelength UV light. The cure is not inhibited by oxygen, and hence any areas in contact with air can be fully cured to a non-tacky state.

For some UV curable adhesive materials described herein, curing can be done in two steps. First a short exposure, or precure, is used. The precure can cure the adhesive material enough to allow it to be handled. In some embodiments, the UV curable adhesive material can be precured and then applied onto the substrate. In some embodiments, the UV curable adhesive material can be disposed on the substrate followed by the precure. Full cure can be completed by exposure for the remainder of the cure time. A full cure may take, for example, 10 to 30 times the precure time using the same intensity light source.

The substrate 2 can include any flexible material such as, for example, polyurethane, rubber, epoxy, polyethylene terephthalate (PET), polyethylene, polystyrene, silicone elastomer (e.g. PDMS), etc. In one example prepared in this disclosure, a polyurethane film was used as a flexible substrate, which is commercially available from 3M Company St. Paul, MN, under the trade designation of COTRAN 9701. It is to be understood in some embodiments, a portion of the substrate 2 may be rigid, while the substrate 2 as a whole can be flexible.

In many embodiments, the substrate 2 may be a portion of a continuous web. The web may be used in a high-speed, roll-to-roll manufacturing process to electrically connect circuit components to rapidly produce low-cost circuits for electronic devices including, for example, radio-frequency identification (RFID) tags, near field communication (NFC) circuits, Bluetooth circuits, Wi-Fi circuits, microprocessor chips, bare dies, capacitors, accelerometer chips, and the like.

The layer 4 of curable adhesive material can be applied on the substrate 2 by any suitable processes, including, for example, brushing, screen printing, roll coating, transfer printing, melt processing, dispensing, or by physically applying. The layer 4 may have a wet thickness, for example, in the range of 10 micrometers to 10 mm. It is to be understood that the layer 4 may have any desired thickness depending on the desired applications.

Figure 2:
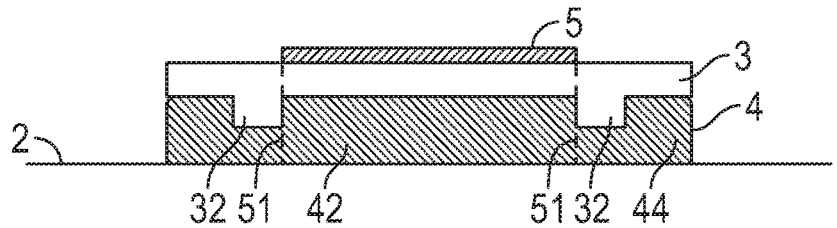
FIG. 2 is a cross-sectional view of an article by placing a stamp on the top of curable adhesive material of FIG. 1, according to one embodiment.

FIG. 2 is a cross-sectional view of the layer 4 of curable adhesive material of FIG. 1 where a stamp 3 is placed on the top. The stamp 3 includes raised features 32 that are arranged in a pattern on a major surface thereof. When the stamp 3 contacts the layer 4 of curable adhesive material, the raised features 32 can press into the adhesive surface 41 to replicate the pattern of features onto the adhesive surface 41.

Polydimethylsiloxane (PDMS) is particularly useful as a stamp material, as it is elastomeric and has a low surface energy (which makes it easy to remove the stamp from most substrates). A useful commercially available formulation is available from Dow Corning, Midland, MI, under the trade designation Sylgard 184 PDMS. PDMS stamps can be formed, for example, by dispensing an un-crosslinked PDMS polymer into or against a patterned mold, followed by curing. The master tool for molding the elastomeric stamps can be formed using photolithography techniques known in the art. The elastomeric stamp can be molded against the master tool by applying uncured PDMS to the master tool and then curing.

Figure 3:
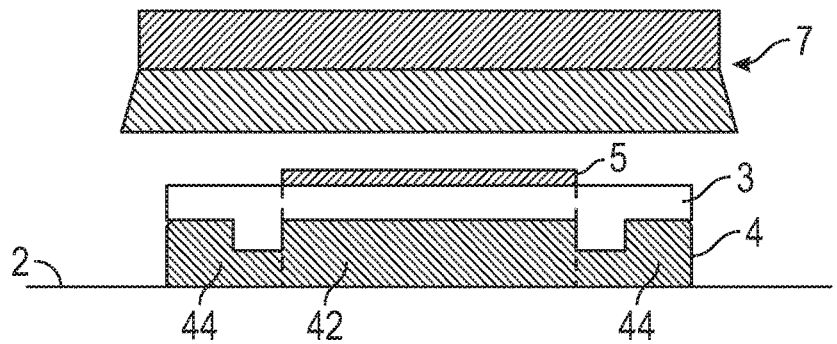
FIG. 3 is a plan view of an article by partially curing the layer of curable adhesive material of FIG. 1, according to one embodiment.

In the embodiment depicted in FIG. 2, a mask 5 is provided on the stamp 3 on the side opposite the raised features 32. When an actinic light source 7 is provided to cure the curable adhesive material 4, as shown in FIG. 3, the mask 5 can at least partially block the exposure of actinic radiation from the actinic light source 7 to a first region 42 of the curable adhesive material 4. The first region 42 is defined by the footprint of the mask 5 as denoted by the dashed lines 51. The mask 5 can be made of any suitable material to at least partially block the actinic radiation. One exemplary mask can be made of a black opaque material commercially available from 3M Company, St. Paul, MN, under the trade designation of Scotch Photographic Tape 235.

As shown in FIG. 3, the adhesive composition in the second region 44 receives sufficient amount of actinic radiation to be cured to form a non-tacky, dimensionally stable solid mass. The first region 42, which was blocked by the mask 5 from the actinic radiation, is less cured than the second region 44. The surface of the less cured adhesive composition in the first region 42 may remain wet and/or tacky. In some embodiments, the amount of actinic radiation received by the first region 42 may be less than 50%, less than 40%, less than 30%, less than 20%, or less than 10% of the amount of actinic radiation received by the second region 44.

In the embodiment depicted in FIG. 3, the mask 5 is disposed on the side of the stamp 3 opposite to the raised features 32. It is to be understood that the mask 5 can be disposed at any suitable location to block the actinic radiation from the actinic light source 7. In some embodiments, the mask 5 can be disposed on the same side of the stamp 3 as the raised features 32.

In the embodiment depicted in FIG. 3, the actinic light source 7 and the mask 5 are disposed on the same side of the layer 4 of the curable adhesive material as the stamp 3. It is to be understood that the actinic light source 7 and the mask 5 can be disposed on the side of the substrate 2 opposite to the stamp 3. The mask 5 can be attached to a light head of the actinic light source 7 to at least partially block the actinic light to access to the first region 42, while the actinic light can transmit through the substrate 2 to fully cure the second region 44.

Figure 4:
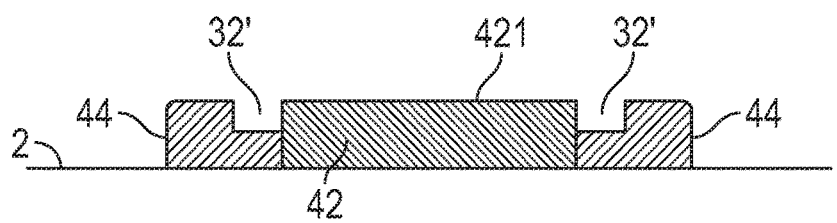
FIG. 4 is a cross-sectional view of an article after removing the stamp from the curable adhesive material of FIG. 3, according to one embodiment.

As shown in FIG. 4, a pattern of microstructures 32' is formed on the major surface 41 of the curable adhesive material 4. The pattern of microstructures 32' is replicated from the raised features 32 of the stamp 3 by contacting the stamp 3 to the major surface 41 of the curable adhesive material 4. The microstructures 32' may include, for example, channels, partial holes, through holes, cavities, pockets, etc. The microstructures 32' are formed substantially on the second region 44 of the curable adhesive material.

In various embodiments, the microstructures 32' may have a minimum dimension (e.g., any of length or width/thickness) of, for example, 500 micrometers or less, 300 micrometers or less, 100 micrometers or less, 50 micrometers or less, or 10 micrometers or less. One exemplary microchannel may have a width of about 50 to about 500 micrometers, and a depth of about 10 to 100 micrometers.

In the depicted embodiment of FIG. 3, the stamp 3 is positioned in contact with the curable adhesive material 4 to replicate the pattern of microstructures 32 while the curable adhesive material 4 is selectively cured by the actinic light source 7. Then the stamp 3 is removed from the curable adhesive material 4 to reveal the pattern of microstructures 32' thereon. It is to be understood that formation of the pattern of microstructures 32' and the selective cure of the curable adhesive material 4 can be conducted in various orders or sequences.

In some embodiments, the curable adhesive material 4 can be precured by the actinic light source 7 up to a level that the raised features 32 of the stamp 3 can still press into the major surface 41 to replicate a pattern thereon. Then the stamp 3 is positioned to contact the major surface 41 of the curable adhesive material 4 while the actinic light source 7 continues to fully cure the second regions 44. Then the stamp 3 is removed from the curable adhesive material 4 to reveal the pattern of microstructures 32'.

Figure 5A:
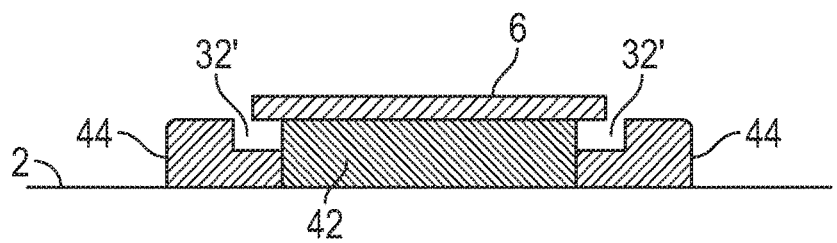
FIG. 5A is a cross-sectional view of an article by placing a solid circuit die on the adhesive material, according to one embodiment.
Figure 5B:
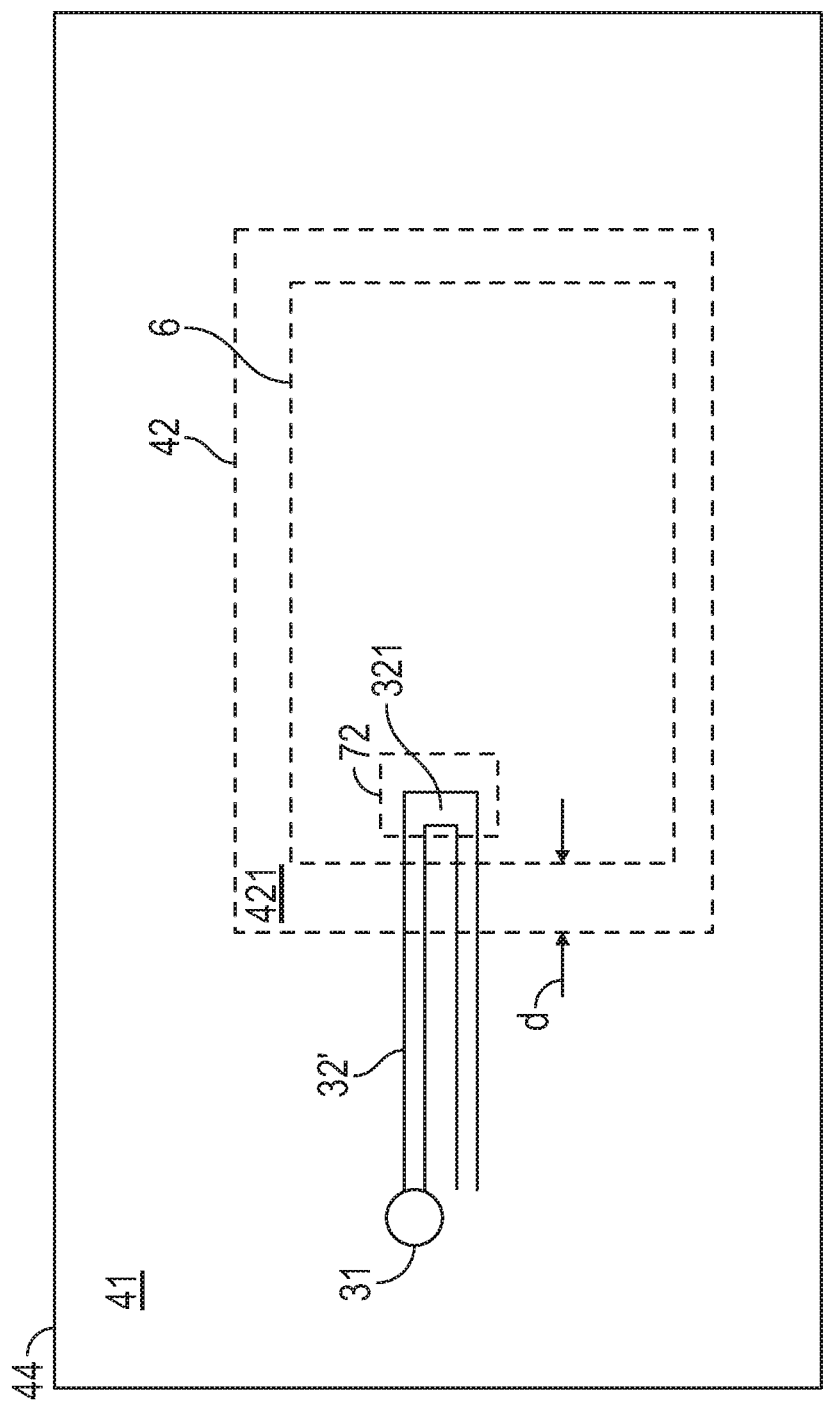
FIG. 5B is a top view of a portion of the article of FIG. 5A.

After the stamp 3 is removed from the curable adhesive material 4, a solid circuit die 6 is attached to the surface 421 of the first region 42, as shown in FIGS. 5A-B. As discussed above, the first region 42 has been at least partially blocked by the mask 5 from the actinic radiation and was less cured than the second region 44. In other words, the first region 42 is not cured or only partially cured in such an amount that its surface 421 can wet out the bottom surface of the solid circuit die 6 in a way such that (i) there is no substantial amount of air or continuous air path between the solid circuit die 6 and the surface 421; (ii) the edge of the solid circuit die 6 can be fluidly-sealed by the surface 421; (iii) the edges of the microstructures (e.g., the edges of microchannel 321 in FIG. 5B) under the solid circuit die 6 can be fluidly-sealed; and (iv) a good adhesion with bottom surface of the solid circuit die 6 upon further cure of the first region 42.

In the embodiment depicted in FIG. 5B, the microstructures 32' are primarily formed on the second region 44 surrounding the first region 42. The second region 44 can be cured at the second level such that the microstructures 32' can mechanically sustain after the removal of the stamp. At least one of the microchannels 32' on the major surface 41 extends into the first region 42 to access to a bottom surface of a solid circuit die disposed on the first region 42. The solid circuit die 6 has one or more contact pads 72 on a bottom surface thereof. The solid circuit die 6 is aligned with the major surface 41 of the curable adhesive material such that the contact pad 72 faces a portion 321 of a microchannel 32' that extends beneath the contact pad 72. It is to be understood that the solid circuit die 6 and the microstructures (e.g., the microchannels 32', through holes 31, cavities, pockets, etc.) formed by the curable adhesive material may have various configurations and arrangements for desired applications.

The solid circuit die 6 can be disposed within a periphery of the wet surface 421 of the first region 42 that is less cured than the second region 44. The size or area of the wet surface 421 can be controlled by one or more of (i) varying the size or area of the mask 5 of FIGS. 2 and 3, (ii) the relative position of the mask 5, the actinic light source 7, and the wet surface 421, or (iii) the time of cure. As shown in FIG. 5B, the first region 42 is at least partially blocked from cure such that a gap d between an edge of the surface 421 and an adjacent edge of the solid circuit die 7 occurs. This is to prevent an edge of the die from contacting a fully-cured area (e.g. the non-tacky surface of the second region 44) and thus not being anchored to the major surface 41, which may induce fluid leakage in following steps to make a device. The gad d may be in the range of, for example, from about 0.1 mm to about 10 mm.

A solid circuit die described herein can include one or more circuit chips having certain circuitry function(s). In some embodiments, a solid circuit die may include a circuit chip having one or more contact pads arranged along a surface thereof, a rigid semiconductor die, a printed circuit board (PCB), a flexible printed circuit (FPC), an ultra-thin chip, a radio frequency identification device (RFID), a near field communication (NFC) module, surface-mount devices, etc. In some embodiments, a solid circuit die can be an ultra-thin chip with a thickness of about 2 micrometers to about 200 micrometers, about 5 micrometers to about 100 micrometers, or about 10 micrometers to about 100 micrometers.

In some embodiments, a solid circuit die can include a rigid or flexible semiconductor die. In some embodiments, a solid circuit die can include a printed circuit board (PCB). In some embodiments, a solid circuit die can include a flexible printed circuit (FPC). In some embodiments, a solid circuit die may include electrically conductive plates or traces. It is to be understood that the solid circuit dies described herein can include any suitable circuits to be disposed on a substrate. In some embodiments, one or more contact pads of a solid circuit die or the solid circuit die itself can be registered and connected to electrically conductive traces on a substrate.

Figure 6:
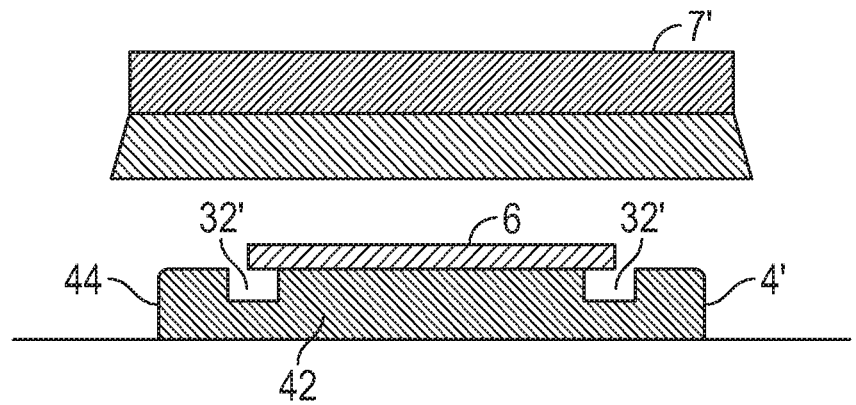
FIG. 6 is a cross-sectional view of an article by further curing the layer of curable adhesive material, according to one embodiment.

When the solid circuit die 6 is attached to the tacky surface of the first region 42, an actinic light source 7' is provided to further cure the first region 42, as shown in FIG. 6. The actinic light source 7' can be the same as or different from the actinic light source 7 of FIG. 3. When the first region 42 is fully cured by the actinic light source 7', a layer of fully cured adhesive material 4' is formed, where the solid circuit die 6 is anchored to the first region 42 via forming an adhesive bond therebetween.

In some embodiments, when the solid circuit die 6 is at least partially transparent to the light from the actinic light source 7', the actinic light source 7' can be positioned on the same side as the solid circuit die 6 with respect to the layer of curable adhesive material 4. Otherwise, the actinic light source 7' can be positioned on the side of the substrate 2 to cure the first region 42 of curable adhesive material. It is to be understood that the curable adhesive material at the first region 42 can be further cured by any suitable curing method such as, for example, thermal curing, radiation curing, etc. In some embodiments, the first region 42 can be self-cured at room temperature without using a thermal or radiation curing source.

Figure 7:
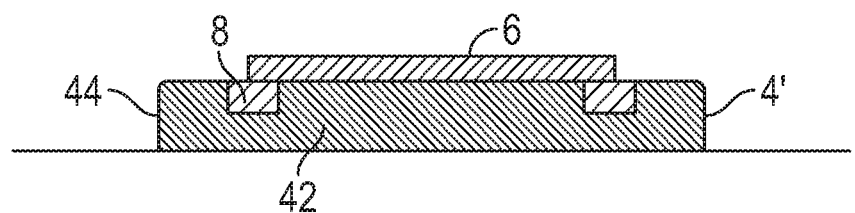
FIG. 7 is a cross-sectional view of the article of FIG. 6 where a conductive ink is applied, according to one embodiment, according to one embodiment.

Referring to the article shown in FIG. 7, a conductive particle-containing liquid 8 is placed in the microchannels 32' and flowed along the microchannels 32' to make a direct contact with the contact pads 72 of the circuit die 7 (see also FIG. 5B). In various embodiments, the microchannels 32' may have a minimum dimension (e.g., any of length or width/thickness) of, for example, 500 micrometers or less, 300 micrometers or less, 100 micrometers or less, 50 micrometers or less, or 10 micrometers or less. One exemplary microchannel may have a width of about 50 to about 500 micrometers, and a depth of about 10 to 100 micrometers.

The conductive particle-containing liquid 8 can be any electrically conductive liquid composition containing conductive particles that is flowable, or can be made to flow, in the microchannels 32'. In some embodiments, the conductive particle-containing liquid 8 can be formulated to allow flow along the microchannels 32' primarily by a capillary force.

In various embodiments, the conductive particle-containing liquid 8 can be any liquid composition that is electrically conductive in a liquid state (for example, metals), or is electrically non-conductive or weakly conductive in a liquid state and becomes electrically conductive when solidified. In some embodiments, the conductive particle-containing liquid 8 includes a sufficient amount of a liquid carrier to make the conductive particle-containing liquid flowable in the microchannels 32' primarily by a capillary force. In some embodiments, the conductive particle-containing liquid 8 can be made to flow in the microchannels 22 by applying the conductive particle-containing liquid under pressure in the microchannels 32' under pressure to enhance capillary flow.

The conductive particle-containing liquid 8 includes an electrically conductive material, or an electrically non-conductive material that can be converted into an electrically conductive material, which is dispersed in a liquid to facilitate more uniform deposition into the microchannels 32' by using, for example, a coater or sprayer. Suitable electrically conductive materials for the conductive particle-containing liquid 8 include, but are not limited to, metal particles, nanowires, metal salts that are conductive at room temperature or become conductive when heated or otherwise reduced to metals, conductive polymers, and mixtures and combinations thereof. In some embodiments, the conductive particle-containing liquid 8 includes conductive inks including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. In some embodiments, the conductive particle-containing liquid 8 is a conductive ink that is activated or curable with actinic radiation such as, for example, a UV curable or activated ink.

In some embodiments, the conductive material in the conductive particle-containing liquid 8 may be silver flakes or spheres, a blend of carbon/graphite particles or a blend of silver flakes/carbon particles. Particle sizes typically range from, for example, about 0.5 micrometers to about 10.0 micrometers in diameter. When these flakes or particles are suspended in the polymer binder, they are randomly spaced through the liquid. Once the solvent is evaporated, they condense, forming a conductive path or circuit. Of the conductive materials, silver is the least resistive and the most expensive while carbon/graphite offers the best combination of low resistance and low price. Suitable conductive inks are available from, for example, Tekra, Inc., New Berlin, WI; Creative Materials, Inc., Ayer, MA; or NovaCentrix, Austin, TX.

Any non-corrosive liquid in which the conductive materials can form a stable dispersion can be used in the conductive particle-containing liquid 8, and suitable examples of liquid carriers include, but are not limited to, water, alcohols, ketones, ethers, hydrocarbons or an aromatic solvent (benzene, toluene, xylene, etc.). In some embodiments, the carrier liquid is volatile, having a boiling point of no more than 200 degrees C. (° C.), no more than 150° C., or no more than 100° C.

In addition, the conductive particle-containing liquid 8 may contain additives or binders to control viscosity, corrosion, adhesion, and dispersion of the conductive material. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DowDuPont).

In one example, a conductive particle-containing liquid, or "ink," includes, by weight, from 0.0025% to 0.1% surfactant (e.g., a preferred range is from 0.0025% to 0.05% for Zonyl FSO-100), from 0.02% to 4% viscosity modifier (e.g., a preferred range is 0.02% to 0.5% for HPMC), from 94.5% to 99.0% solvent and from 0.05% to 1.4% conductive materials. Representative examples of suitable surfactants include those available from DowDuPont, Wilmington, DE, under the trade designations Zonyl FSN, Zonyl FSO, and Zonyl FSH, those available from Millipore Sigma, St. Louis, MO, under the trade designations Triton (×100, ×114, ×45), those available from Evonik Industries, Parsippany, NJ, under the trade designations Dynol (604, 607), n-dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present includes the aforementioned binders or additives, including water and isopropanol.

In another embodiment, the conductive particle-containing liquid 8 can include an adhesive such as, for example, adhesives dissolved in liquid solvents such as water acetone, toluene, methyl ethyl ketone (MEK), and the like.

The conductive particle-containing liquid 8 can be delivered at any position along the microchannels 32'. The conductive particle-containing liquid 8 can be deposited in the microchannels 32' by various methods including, for example, pouring, funneling, ink jet printing, piezo dispensing, needle dispensing, micro-injection, screen printing, flexographic printing, sputtering, vapor deposition, and the like.

The conductive particle-containing liquid 8 can be cured, hardened or solidified by removing at least portion of the liquid carrier to leave a continuous layer of electrically conductive material that forms an electrically conductive trace in the microchannels 32'. The conductive particle-containing liquid 8 may be cured and/or hardened or sintered. "Cured or solidified" refers to a process where the solvent or liquid carrier is removed from the conductive particle-containing liquid 8 to form an interconnect circuit pattern. Suitable curing conditions are well known in the art and include by way of example, heating, irradiating with visible or ultraviolet (UV) light, electron beams, and the like. Alternatively, "harden(s) or hardening" may be caused by solvent removal during drying, for example, without polymerization or crosslinking.

Figure 8:
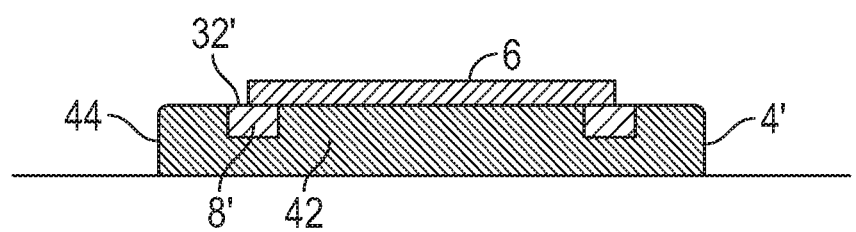
FIG. 8 is a cross-sectional view of the article of FIG. 7 where the conductive ink is solidified to form electrically conductive traces.

As shown in FIG. 8, the conductive particle-containing liquid is solidified to form one or more electrically conductive traces 8' in the microchannels 32'. The formed device includes a layer of ultraviolet (UV) cured adhesive material 4'. The layer 4' includes a first region 42 and a second region 44 at least partially surrounding the first region 42. The layer 4' extends continuously from the first region 42 to the second region 44. The solid circuit die 6 is directly adhered to a major surface of the first region 42' via an adhesive bond. The footprint of the solid circuit die 6 may be slightly smaller than the major surface of the first region 42' to which the die 6 is attached. A pattern of microchannels 32' are formed on the layer 4' of ultraviolet (UV) cured adhesive material. Electrically conductive traces 8' are provided in the microchannels to provide electrical connections.

The operation of the present disclosure will be further described with regard to the following embodiments. These embodiments are offered to further illustrate the various specific and preferred embodiments and techniques. It should be understood, however, that many variations and modifications may be made while remaining within the scope of the present disclosure.

LISTING OF EXEMPLARY EMBODIMENTS

It is to be understood that any one of embodiments 1-10, 11-15 and 16-20 can be combined. Embodiment 1 is a method comprising:
- providing a layer of curable adhesive material on a substrate;
- forming a pattern of microstructures on the layer of curable adhesive material;
- curing a first region of the layer at a first level and a second region of the layer at a second level greater than the first level;
- providing a solid circuit die to directly attach to a major surface of the first region of the layer; and
- further curing the first region of the layer to anchor the solid circuit die on the first region by forming an adhesive bond therebetween.

Embodiment 2 is the method of embodiment 1, wherein the pattern of microstructures includes one or more microchannels, the method further comprising forming one or more electrically conductive traces in the microchannels.

Embodiment 3 is the method of embodiment 1 or 2, wherein forming the pattern of microstructures comprises contacting a major surface of a stamp to the layer of curable adhesive material, the major surface having a pattern of raised features thereon.

Embodiment 4 is the method of embodiment 3, wherein the stamp comprises polydimethylsiloxane (PDMS) on the major surface thereof.

Embodiment 5 is the method of any one of embodiments 1-4, wherein the curable adhesive material is cured by an ultraviolet (UV) light source.

Embodiment 6 is the method of embodiment 5, further comprising providing a mask to at least partially block the first region of the layer from the cure.

Embodiment 7 is the method of embodiment 6, wherein the amount of UV light received by the first region is less than 50% of the amount of UV light received by the second region.

Embodiment 8 is the method of any one of embodiments 1-7, wherein the first region of the layer is cured at the first level to allow a bottom surface of the solid circuit die be fluidly-sealed by the major surface of the first region.

Embodiment 9 is the method of any one of embodiments 1-8, wherein the second region of the layer is cured at the second level such that the second region is fully cured.

Embodiment 10 is the method of any one of embodiments 1-9, wherein the solid circuit die has at least one edge disposed within a periphery of the first region with a gap therebetween.

Embodiment 11 is an article comprising:
- a layer of ultraviolet (UV) cured adhesive material, the layer including a first region and a second region at least partially surrounding the first region, the layer extending continuously from the first region to the second region;
- a solid circuit die directly adhered to a major surface of the first region via an adhesive bond;
- a pattern of microstructures formed on the layer of ultraviolet (UV) cured adhesive material; and
- one or more electrically conductive traces in the microchannels.

Embodiment 12 is the article of embodiment 11, wherein the pattern of microstructures including at least one microchannel extending from the second region to the first region and having a portion beneath the solid circuit die.

Embodiment 13 is the article of embodiment 11 or 12, wherein the solid circuit die has at least one contact pad on a bottom surface thereof.

Embodiment 14 is the article of embodiment 13, wherein the at least one contact pad is in direct contact with at least one of the electrically conductive traces in the microchannels.

Embodiment 15 is the article of any one of embodiments 11-14, wherein the pattern of microstructures is formed substantially on the second region.

Embodiment 16 is an article comprising:
- a layer of adhesive material, the layer including a first region and a second region at least partially surrounding the first region, the first region being less cured than the second region, the layer extending continuously from the first region to the second region;
- a solid circuit die directly attached to a major surface of the first region;
- a pattern of microstructures primarily formed on the second region of the adhesive material; and
- one or more electrically conductive traces in the microchannels.

Embodiment 17 is the article of embodiment 16, wherein the pattern of microstructures including at least one microchannel extending from the second region to the first region and having a portion beneath the solid circuit die.

Embodiment 18 is the article of embodiment 16 or 17, wherein the solid circuit die has at least one contact pad on a bottom surface thereof.

Embodiment 19 is the article of embodiment 18, wherein the at least one contact pad is in direct contact with at least one of the electrically conductive traces in the microchannels.

Embodiment 20 is the article of any one of embodiments 16-19, wherein the major surface of the first region forms a fluidly sealing with the bottom surface of the solid circuit die.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Unless otherwise noted, all parts, percentages, ratios, etc. in the Examples and the rest of the specification are by weight. In addition, Table 1 provides abbreviations and a source for all materials used in the Examples below:

TABLE 1

| Abbreviation | Description | Source |
| --- | --- | --- |
| NOA73 | Optically clear, liquid adhesive that quickly cures when exposed to long wavelength ultraviolet light | Norland Products Inc., Cranbury, NJ |
| Mask | 3M ™ Scotch Photographic Tape 235 | 3M Company, St. Paul, MN |
| PDMS | Polydimethylsiloxane, under the trade designation Sylgard 184 PDMS | Dow Corning, Midland, MI |
| Ink | A silver flake ink that becomes conductive after solidification, available under the trade designation 127-07. | Creative Materials Inc, Ayer, MA |

Examples were prepared using the process illustrated in FIGS. 1 through 8. A stamp made of PDMS was used. The stamp has raised features on its contacting surface. A UV light source commercially available from Clearstone Technologies (Hopkins, MN) under the trade designation of CF2000 was used. The stamp is transparent for the UV light from the UV light source. A mask was disposed on the center of the stamp on the side opposite the raised features. The mask was a square of black opaque material commercially available from 3M under the trade designation of Scotch Photographic Tape 235. The UV curable adhesive material was commercially available from Norland Products Inc., Cranbury, NJ, under the trade designation of NOA73. The adhesive was deposited onto a copper substrate using a Nordson EFD Optimum fluid dispensing system equipped with a 30 cc syringe barrel and a 21 gauge stainless steel needle. About 50 microliters of NOA73 was deposited per pattern. No pre-cure or pre-treatment was used. A solid circuit die AS39513 NFC Sensor Tag IC from AMS (Premstaetten, Austria) was used. The die has a size of about 2.4 mm×2.3 mm. The thickness of the die as 300 microns. The size of the bond pads was 80 um×80 um.

The microchannels has a dimension of about 0.12 mm×0.12 mm×10 mm. Instead of anchoring the solid circuit die to the underlying NOA73 by using an additional droplet of NOA73, a partial curing method was used. The mask was applied to the back (non-feature) side of the stamp to prevent interference with the replication of the features into the NOA73. The stamp was positioned to replicate a pattern of microchannels onto the NOA73. With the presence of the mask, the NOA73 was first UV cured with a power of 15 W curing unit at about 385 nm wavelength light for about 45 to 60 seconds.

The stamp was then removed with a selected region of the adhesive NOA73 remaining uncured, while other regions including the microchannels thereon were fully cured to prevent warping or deformation. Next, the die was placed on top of the not-fully cured adhesive, and the tackiness of the uncured portion anchors the chip to the substrate. A post-cure step was completed to cure the rest of the NOA73 with a power of 15 W curing unit at about 385 nm wavelength light for about 45 to 60 seconds. Then silver ink was flowed and sintered at 220° F. for 5 to 10 minutes to form electrically conductive traces in the microchannels.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about." Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method comprising:
   disposing a layer of curable adhesive material on a substrate;
   forming a pattern of microstructures on the layer of curable adhesive material;
   curing a first region of the layer at a first level and a second region of the layer at a second level greater than the first level;
   providing a solid circuit die to directly attach to a major surface of the first region of the layer; and
   further curing the first region of the layer to anchor the solid circuit die on the first region by forming an adhesive bond therebetween.

2. The method of claim 1, wherein the pattern of microstructures includes one or more microchannels, the method further comprising forming one or more electrically conductive traces in the microchannels.

3. The method of claim 1, wherein forming the pattern of microstructures comprises contacting a major surface of a stamp to the layer of curable adhesive material, the major surface of the stamp having a pattern of raised features thereon.

4. The method of claim 3, wherein the stamp comprises polydimethylsiloxane (PDMS) on the major surface thereof.

5. The method of claim 1, wherein the curable adhesive material is cured by an ultraviolet (UV) light source.

6. The method of claim 5, further comprising at least partially blocking, via a mask, the first region of the layer from the cure.

7. The method of claim 5, wherein the amount of UV light received by the first region is less than 50% of the amount of UV light received by the second region.

8. The method of claim 1, wherein the first region of the layer is cured at the first level to allow a bottom surface of the solid circuit die be fluidly-sealed by the major surface of the first region.

9. The method of claim 1, wherein the second region of the layer is cured at the second level such that the second region is fully cured.

10. The method of claim 1, wherein the solid circuit die has at least one edge disposed within a periphery of the first region with a gap therebetween.

11. An article comprising:
- a layer of ultraviolet (UV) cured adhesive material, the layer including a first region and a second region at least partially surrounding the first region, the layer extending continuously from the first region to the second region;
- a solid circuit die directly adhered to a major surface of the first region via an adhesive bond;
- a pattern of microstructures formed on the layer of ultraviolet (UV) cured adhesive material, wherein the pattern of microstructures includes one or more microchannels extending from the second region to the first region and ha a portion beneath the solid circuit die; and
- one or more electrically conductive traces in the microchannels.

12. The article of claim 11, wherein the solid circuit die has at least one contact pad on a bottom surface thereof.

13. The article of claim 12, wherein the at least one contact pad is in direct contact with at least one of the electrically conductive traces in the microchannels.

14. The article of claim 11, wherein the pattern of microstructures is formed substantially on the second region.

* * * * *